(12) United States Patent
Nafisi-Movaghar et al.

(10) Patent No.: US 8,420,140 B2
(45) Date of Patent: Apr. 16, 2013

(54) GALVANIC PACKAGE FOR FRUITS AND VEGETABLES AND PRESERVATION METHOD

(75) Inventors: Karim Nafisi-Movaghar, Walnut Creek, CA (US); Loren Druz, Clayton, CA (US)

(73) Assignee: Del Monte Corporation, San Francisco, CA (US)

( * ) Notice: Subject to any disclaimer, the term of this patent is extended or adjusted under 35 U.S.C. 154(b) by 310 days.

(21) Appl. No.: 12/882,437

(22) Filed: Sep. 15, 2010

(65) Prior Publication Data

US 2012/0064201 A1    Mar. 15, 2012

(51) Int. Cl.
*A21D 10/02*    (2006.01)

(52) U.S. Cl.
USPC ........... 426/107; 426/234; 426/237; 426/244; 426/398; 205/740

(58) Field of Classification Search ............ 426/106, 426/107, 124, 126, 131, 234, 244, 262, 322–324, 426/398; 428/35.8, 35.3; 204/196.1, 196.18, 204/196.22, 196.23, 196.24, 196.25, 196.37; 205/740; 206/524.9, 524.5; 220/62.17
See application file for complete search history.

(56) References Cited

U.S. PATENT DOCUMENTS

| | | | | |
|---|---|---|---|---|
| 1,958,765 | A * | 5/1934 | Perkins | 204/196.17 |
| 2,219,772 | A * | 10/1940 | Gernhardt | 426/244 |
| 2,405,662 | A * | 8/1946 | McManus et al. | 204/192.32 |
| 2,982,440 | A | 5/1961 | Harrison | |
| 3,136,468 | A | 6/1964 | Keller | |
| 3,210,199 | A | 10/1965 | Schlaf | |
| 3,268,344 | A * | 8/1966 | Kamm | 426/126 |
| 3,281,008 | A | 10/1966 | D'Andrea | |
| 3,317,107 | A | 5/1967 | Williams | |
| 3,524,568 | A | 8/1970 | Nughes | |
| 3,547,294 | A | 12/1970 | Williams | |
| 3,888,224 | A * | 6/1975 | Okuhara et al. | 426/126 |
| 4,201,637 | A * | 5/1980 | Peterson et al. | 205/731 |
| 4,374,714 | A * | 2/1983 | Hekal | 426/239 |
| 4,959,516 | A * | 9/1990 | Tighe et al. | 219/730 |
| 6,346,318 | B1 | 2/2002 | Panchyshyn | |
| 8,163,159 | B2 * | 4/2012 | Sjong | 205/740 |
| 2007/0166494 | A1 | 7/2007 | Bergsmann et al. | |
| 2011/0045218 | A1 * | 2/2011 | Harper et al. | 428/34.2 |
| 2011/0215099 | A1 * | 9/2011 | Caunter et al. | 220/269 |

FOREIGN PATENT DOCUMENTS

JP    2000032968 A  *  2/2000

* cited by examiner

*Primary Examiner* — Drew Becker
*Assistant Examiner* — Luana Z Long
(74) *Attorney, Agent, or Firm* — Buchanan Ingersoll & Rooney PC

(57) ABSTRACT

A package for fruits and vegetables having galvanic functionality is formed by using two or more metals with different galvanic activity properties on the surface of a nonmetallic substrate. The metals may be deposited electrolytically, by vacuum, autocatalytically, or by other methods. The metals are selected to create a galvanic reaction after the package is filled with a low pH food product and its associated liquids, juices, brine, etc. The package may extend the shelf-life of the food product contained therein, for example, by making metal ions available to the food product.

30 Claims, 6 Drawing Sheets

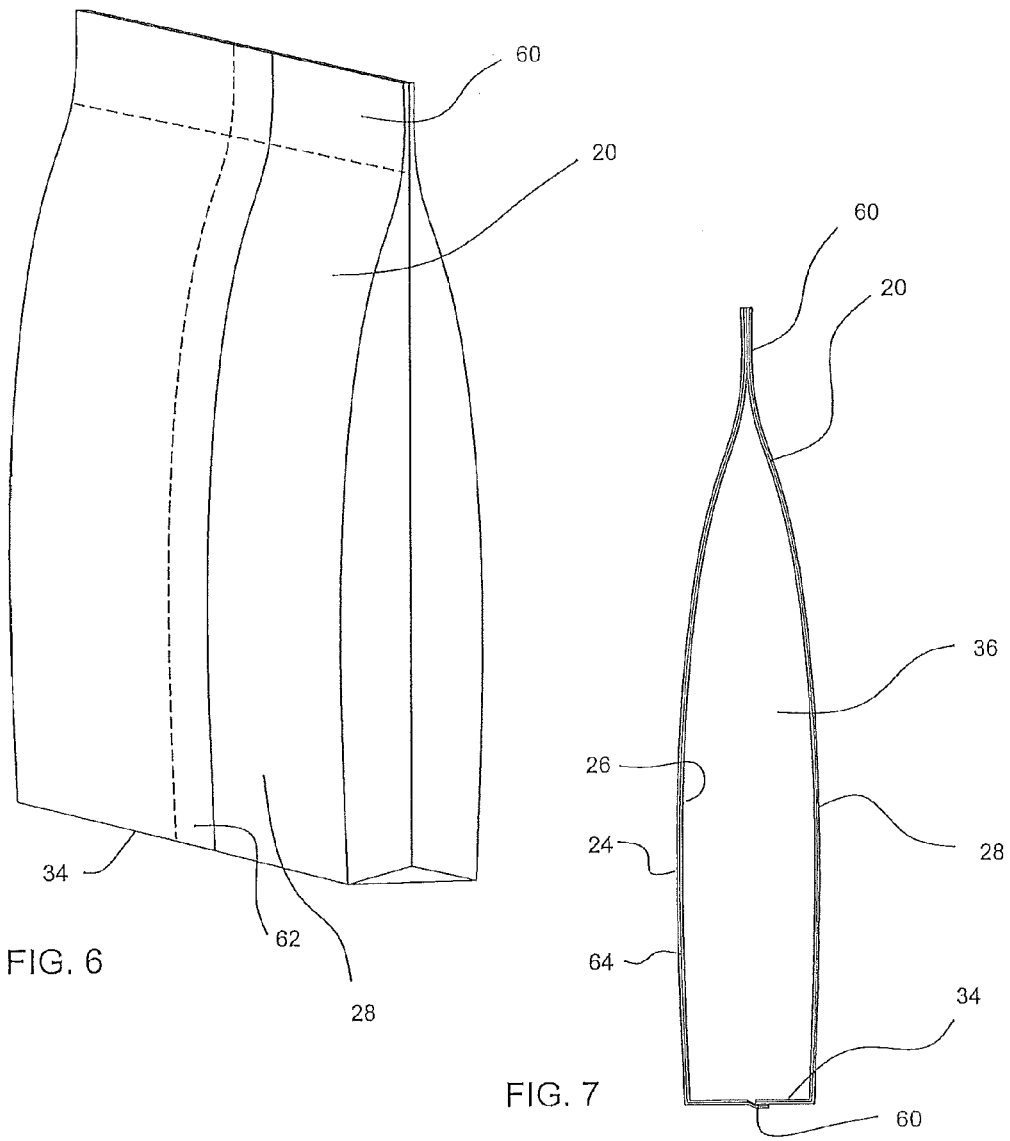

GALVANIC PACKAGE FOR FRUITS AND VEGETABLES AND PRESERVATION METHOD

BACKGROUND

Packages which can extend the shelf-life of fruit and vegetables are desirable. Typical packages for fruits and vegetables include aluminum cans, tin-coated steel cans, enamel-coated steel cans, and/or plastic cups having a set shelf-life.

Generally speaking, known packaging for fruits and vegetables has a predetermined, limited shelf life. Toward the end of, and after expiration of, the shelf-life period the packaged fruits and/or vegetables experience color degradation. Especially for packages having transparent covers, such color degradation tends to adversely affect marketability. That adverse affect is due, at least in part, to consumer shoppers being sensitive to off-color products, such as browning.

Many fruits and vegetables are seasonally available. Where the shelf-life of consumer packaging is much less than the time between successive growing seasons, it is sometimes required to temporarily preserve the fruit or vegetable during bulk storage, and then prepare consumer packaging from the bulk storage containers.

Thus, consumer packaging for fruits and vegetables having a shelf life exceeding the time between consecutive harvesting seasons, e.g., a year or more for annual crops, has significant desirability.

SUMMARY OF SELECT ASPECTS

This specification generally concerns a package having galvanic functionality for fruits and vegetables. The package may be formed from a plastic substrate having two or more metals with different galvanic activity properties on the surface of the substrate. The package may be formed from a substrate to which the metals have been applied, or from a substrate free of the metals and to which the metals are applied following package formation. The metals may be deposited as thin films electrolytically, by vacuum, autocatalytically, or by other methods. The metals are selected to create a galvanic reaction after the package is filled with a low pH food product and its associated liquids such as syrup, juices, brine, etc. and then sealed. During the shelf-life of the package, electrolysis occurs within the package, with the result that one of the metal films, i.e., one electrode, is sacrificed. The package may extend the shelf-life of the food product contained therein, for example, by making tin ions available to the associated food product.

A package for fruits and vegetables having galvanic functionality according to this disclosure preferably includes a container formed of a nonmetallic substrate, and a cover or lid formed from a nonmetallic substrate, such that the container and the cover define a storage unit or storage volume. The package structure may be flexible or rigid, as may be desired. A lining including a first metal is deposited on the inner surface of the package. More particularly, the first metal deposit may be applied to the surface (or a portion of the surface) of the container and/or the cover so as to face and be exposed to the storage volume. A second metal deposit may be applied to the surface (or a portion of the surface) of the container and/or the cover so as to face and be exposed to the storage volume. Alternatively, the second metal may be placed or deposited in the storage unit. The first metal and the second metal have different galvanic activity properties.

In a preferred embodiment, the first metal and the second metal are selected from the group consisting of aluminum, tin, copper, magnesium, chromium, iron, zinc, nickel, cobalt, and combinations thereof.

Preferably, the container is shaped like a tub, pouch, can, cup, or the like. The particular shape may be cylindrical, frustoconical, tray-like, and can be selected as may be desired. Typically, the storage volume is proportioned so that the product to be packaged will yield a consumer-sized package or an institutional bulk package. The storage unit preferably includes a bottom, at least one sidewall surrounding the bottom, and a peripheral upper edge at the upper portion of the sidewall. A peripheral flange may be provided at the upper edge of the container to facilitate attachment of the lid.

The lid itself may be transparent, translucent, or opaque depending on the food product to be packaged, the desire for optical inspection or display of the package contents, and/or the need to limit light entering the package. The lid is sealed to the upper peripheral edge of the container in a suitable manner using, for example, heat, adhesive, or the like. Moreover, the lid may be generally planar so that it can be applied as a sheet to the open top of the container. Alternatively, the lid may have a three-dimensional configuration extending above the container to thereby enlarge the storage volume, or extending into the upper portion of the container to thereby reduce the storage volume while increasing the potential area for sealing the lid to the container. The lid may be formed from a nonmetallic substrate which is the same, or which is different from the nonmetallic substrate from which the container is fabricated.

Typically, the plastic substrate includes at least one plastic layer selected from the group consisting of polyethylene, polypropylene, polyethylene terephthalate, polycarbonate, polyvinyl chloride and combinations thereof. The substrate may be a multi-layer structure where materials having other desired characteristics are necessary or appropriate. Where a multi-layer structure is used, the lid and the container may be fashioned from different multi-layer structures.

In the preferred embodiment, the package contains one or more fruits and/or vegetables in a sauce, brine, or packaging solution. Normally, that sauce, brine or packaging solution has a pH ranging from about 2 to about 8. More preferably, the packaging solution has an acidic pH. Even more preferably, the packaging solution has a pH lower than about 4.6.

A method of making a package for fruits and vegetables having galvanic functionality according to this disclosure includes forming a storage unit of plastic material, and depositing a first metal and a second metal on at least one internal surface of the storage unit. Preferably, the first metal and the second metal are selected to have different galvanic activity properties. In the preferred embodiment, the metal deposition step can be accomplished by electrolytic deposition, by vacuum deposition, or by autocatalytic deposition.

A method of packaging fruits and/or vegetables according to this disclosure includes forming a nonmetallic storage unit having a lining including a first metal and a second metal, placing a predetermined quantity of fruit and/or vegetable in the nonmetallic storage unit, and sealing the nonmetallic storage unit. When a lid is used, the lid is applied to the filled container and then sealed to the container. Preferably, the first metal and the second metal have different galvanic activity properties. Also preferably, the fruits and/or vegetables have a pH ranging from about 2 to about 8. Preferably, the first metal and the second metal are selected from the group consisting of aluminum, tin, copper, magnesium, chromium, iron, zinc, nickel, cobalt, and combinations thereof.

BRIEF DESCRIPTION OF THE DRAWINGS

Many objects and advantages of this invention will be apparent to those skilled in the art when this description is read in conjunction with the appended drawings wherein like reference numerals have been applied to like elements and wherein:

FIG. 6 is a schematic perspective view of a pouch configuration for the package.

FIG. 7 is a cross-sectional view of the package of FIG. 6.

DETAILED DESCRIPTION

Figure 1:
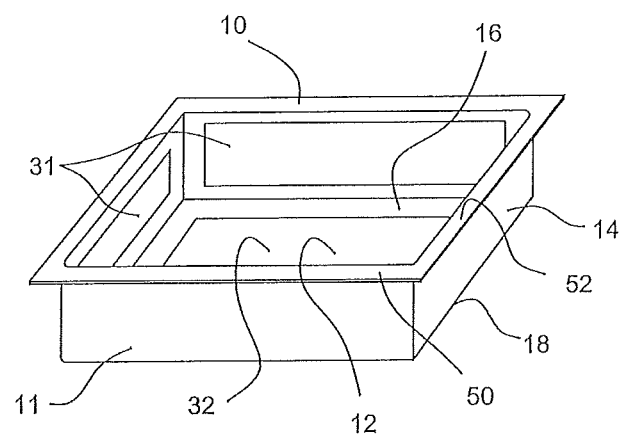
FIG. 1 is a schematic perspective view of a tray-like package with a transparent lid.

A package for a food product having galvanic functionality preferably includes a container portion and a lid portion that cooperate to define a storage unit with an internal storage volume. On the inside of the package, facing the storage volume, and exposed to that storage volume, two or more metal areas are provided, with the two or more metal areas having different galvanic activity. A food product having a low pH is disposed in the storage volume. The food product may comprise a fruit, a plurality of fruits, a vegetable, a plurality of vegetables, or a combination thereof. The food product may be packaged in a brine, syrup, sauce, juice, gravy, or the like so that the package contents have a pH in the preferred range of less than about 8. More preferably, the pH is less than about 5, and most preferably the pH is less that about 4.6. Where the pH is less than about 4.6, botulism spores and botulism microorganisms do not grow and toxins do not form. At pHs between 4.6 and 8, appropriate sterilization techniques must also be employed in the packaging process.

Suitable fruits and/or vegetables are selected from the group consisting of apples, pears, pineapple, star fruit, grapes, peaches, plums, apricots, cherries, blueberries, citrus fruits (e.g., grapefruits, oranges, lemons, limes, etc.), green beans, lima beans, navy beans, kidney beans, garbanzo beans, black beans, black eyed peas, green peas, Brussels sprouts, broccoli, carrots, corn, olives, tomatoes, potatoes, asparagus, okra, onions, peppers, lettuce, cabbage, celery, parsnips, leeks, radishes, turnips, beets, mushrooms, artichokes, cucumbers, and combinations thereof.

The storage volume of the package may be selected as desired. More particularly, the storage volume may be selected so that each package provides an individual serving of the food product, e.g. from about 1 oz. to about 10 oz. (about 1.8 to about 18 in.$^3$). Alternatively, the storage volume may be selected so that each package contains a typical family size portion, e.g., about 4 oz. to about 20 oz. (about 7.2 to about 36 in.$^3$). Moreover, the storage volume may even be selected so that the package is suited for institutional use (e.g., from about 75 to about 125 oz., or 135 to about 225 in.$^3$), or even bulk storage of the food product (more than about 125 oz. or more than about 225 in.$^3$). Where bulk storage of the food product is contemplated, the storage volume may be sufficient to hold 1,000 lb. or more of the food product, where the storage volume is determined by dividing the bulk storage weight by the food product density. Due to the enhanced shelf-life of a food product in the galvanic package of the present invention, use as a personal- or family-sized package is preferred.

Many different shapes and configurations for the package are possible. For example, the package may have a transverse cross-sectional shape that is generally circular, generally elliptical, generally square, generally rectangular, generally triangular, generally hexagonal, generally polygonal, and the like. In vertical cross section, the package may have parallel walls, symmetrical walls about a central axis or plane, convergent walls, and the like. Furthermore, the package can be formed as a pouch. Package walls may be either rigid or flexible, as may be desired. In short, the particular configuration of the package is not considered to be limiting.

Turning now to the material for the container portion of the package, the material may be a conventional metal substrate having an inert coating between the metal substrate and the storage volume. Alternatively, and preferably, the container portion of the package may be fashioned from a nonmetallic substrate. More preferably, the substrate may be fashioned from a polymeric material, which for purposes of this disclosure includes plastics material as well as glass, considering that glass is a polymer of silicon dioxide. Even more preferably the suitable plastics material may be selected from the group consisting of ethylene polymers, propylene polymers, styrene polymers, vinyl chloride polymers, halogenated olefin polymers, vinyl polymers, acrylic polymers, polyamides, silicone polymers, polyacetals, poly ethers polycarbonates, polyesters, polyurethanes, polysulfides, polysulphones, petroleum resins, coumaroneidene resins, silicon rubbers, amino-resins, epoxide resins, alkyd resins, polyallyl esters, and combinations thereof. The selected material, or combination of materials, must be a food-grade material meaning that it is safe for direct contact with food. The substrate may also include one or more layers of other materials including metal foils.

Ethylene polymers may include, for example and without limitation, polyethylene (PE), high-density polyethylene (HDPE), low-density polyethylene (LDPE), very low-density polyethylene (VLDPE), and linear low-density polyethylene (LLDPE). Propylene polymers include, for example and without limitation, polypropylene (PP). Styrene polymers include, for example and without limitation, polystyrene (PS), expanded polystyrene (EPS), general-purpose polystyrene (GPPS), and styrene butadiene rubber (SBR). Vinyl chloride polymers include, for example and without limitation, polyvinyl chloride. Vinyl acetate polymers include, for example and without limitation, ethylene-vinyl acetate (EVA) and polyvinyl acetate (PVA). Acrylic polymers include, for example and without limitation, polycacrylonitrile (PAN) and poly methyl methacrylate (PMMA). Polyacetals including, for example and without limitation, polyoxymethylene (POM) and polyethylene oxide (PEO). Polyamindes include, for example and without limitation, aliphatic, semi-aromatic, and aromatic polyamides. Combination materials may, for example and without limitation, include a blend of acrylonitrile butadiene styrene (ABS), polybutylene terephthalate (PBT), and polyethylene terephthalate (PET)—a material having high temperature resistance as well as impact strength.

Most preferably the container material is selected from the group consisting of polyethylene, polypropylene, polyethylene terephthalate, polycarbonate, polyvinyl chloride, and combinations thereof.

The cover or lid portion of the package may be fabricated from the same range of materials discussed above in connection with the container portion. Moreover, the lid portion may comprise a flexible sheet of material, which may also be adapted for peeling away from the container portion. If desired, the lid portion may extend outwardly away from the container portion so as to enlarge the storage volume of the package relative to the container portion. Alternatively, the lid portion may extend inwardly into the container portion so as to reduce the storage volume of the package relative to the container portion alone. Preferably, however, the lid portion will be generally planar so as to simplify its application to the container portion.

Further, the lid portion may be transparent, translucent, or opaque, as may be desired. Generally, the container portion will be translucent or opaque, but it may be transparent if desired.

Where the package will be used for a food product such as a fruit or vegetable, and where the package has one or more portions fabricated from plastic, the oxygen transfer rate ("OTR") is important because reaction of oxygen with the food product leads to discoloration over time, and may create an issue with undesirable organisms. Thus, the OTR can adversely affect shelf-life of the packaged product. Probably the most effective control of OTR, i.e., minimization thereof, can be accomplished by incorporating a metal film in the structure of the package components, e.g., both the lid portion and the container portion. Accordingly, where the substrate for the container portion and/or the lid portion is a plastic material and regulation of oxygen transmission is deemed important, it may be desired to include an oxygen regulation barrier as part of the substrate configuration, e.g., it may be sandwiched between two or more other layers of material.

Regardless of the configuration of the container portion and the lid portion of the package, the package includes at least two different metals exposed to the storage volume. Those two different metals have different galvanic activity properties. While the different metals might be incorporated in the package structure as metal pieces, it is preferred that the metals be applied as coatings on the surface of either the container portion or the lid portion, or both. The different metals may be selected from the following chart, as desired, with the further condition that the metals must be acceptable for contact with the food items being packaged.

| Rank | Anodic Index Rank |
|---|---|
| 1 | Gold, gold-platinum alloy |
| 2 | Rhomium plated on silver-plated copper |
| 3 | Silver, solid or plated; monel metal. High nickel-copper alloys |
| 4 | Nickel, solid or plated; titanium and its alloys, Monel |
| 5 | Copper, solid or plated; low brasses or bronzes; silver solder; German silvery high copper-nickel alloys; nickel-chromium alloys |
| 6 | Brass and bronzes |
| 7 | High brasses and bronzes |
| 8 | 18% chromium-type corrosion-resistant steels |
| 9 | Chromium plated; tin plated; 12% chromium type corrosion-resistant steels |
| 10 | Tin-plate; tin-lead solder |
| 11 | Lead, solid or plated; high lead alloys |

-continued

| Rank | Anodic Index Rank |
|---|---|
| 12 | 2000 series wrought aluminum |
| 13 | Iron, wrought, gray or malleable; plain carbon and low alloy steels |
| 14 | Aluminum, wrought alloys other than 2000 series aluminum, cast alloys of the silicon type |
| 15 | Aluminum, cast alloys other than silicon type; cadmium, plated and chromate |
| 16 | Hot-dip-zinc plate; galvanized steel |
| 17 | Zinc, wrought; zinc-base die-casting alloys; zinc plated |
| 18 | Magnesium and magnesium-base alloys, cast or wrought |
| 19 | Beryllium |

Preferably, the at least two metals are selected from the group consisting of aluminum, tin, copper, magnesium, chromium, iron, zinc, nickel, cobalt, and combinations and alloys thereof. Preferably, the metals are applied to the packaging materials as a film or coating that may be coextensive with the container or lid, or may only be on a portion of the container or lid. If desired, the film or coating of the two metals may be applied to either the container portion or the lid portion. To apply the metals as a film to the packaging material, a metal deposition step can be used including, for example, electrolytic deposition, vacuum deposition, autocatalytic deposition, chemical vapor deposition, plasma enhanced chemical vapor deposition, electron-beam deposition, plasma spray coating, atomic layer deposition, or the like.

When the container portion has been fabricated, it is filled with a food product as described above in a liquid such as a brine, syrup, sauce, juice, gravy, or the like having a pH such that a galvanic cell is established between the two different metals, and the liquid. That galvanic action functions such that, for example, tin and/or other metal ions are made available within the package. Such tin ions are available to react with oxygen so as to effectively remove oxygen as a potential reactant with the food product. That reaction or removal of oxygen continues until the sacrificial metal of the pair of galvanically active metals has been consumed. Accordingly, the size of the sacrificial metal is believed to be effective as a determining factor for the shelf-life of the food product. More particularly, the exposed surface area of the sacrificial metal affects the rate at which it can control oxygen in the package, while the volume of the sacrificial metal affects the length of time that the oxygen can be controlled. Exposure of food products such as those described above to the galvanically active metals in the package thus operates to prevent discoloration and spoilage of the food product, thereby increasing the shelf-life of the package.

Packages formed as described herein have the ability to extend shelf-life, color and flavor of food products placed and sealed therein by, for example, providing metal or tin ions to the fruits and vegetable which react with oxygen in the package and with the food product to prevent discoloration and spoilage.

Heretofore, consumer packages for fruits and vegetables have been fashioned from plastic materials, but have experienced short shelf-lives on the order of a year or so. Considering that the normal distribution channels often introduce storage delays between packaging and retail placement on the order of six months, the current shelf lives are inadequate to provide consumer product year round without an intermediate packaging operation. For example, with those distribution delays, shelf-lives are much shorter than the time between consecutive harvests, and processing of fruits and vegetables has typically required that the food product first be canned in a metal container for storage purposes, e.g., of one-gallon (128 oz.) size. Then, to prepare consumer-sized packages during the time between harvests, the canned food product has been opened and repackaged in consumer-sized packages, with the concomitant waste of the metal container, packaging syrup, and labor cost. The present invention streamlines the packaging process and, because the galvanic packaging has a shelf-life exceeding the time between harvests, the fruits and vegetables can be directly packaged in consumer-sized packages, stored until needed, and then distributed. In other words, the process can avoid the initial canning operation, as well as the opening and repackaging of the previously canned food product.

Furthermore, if desired, the galvanic packaging can provide bulk packaging of the food product after harvest and before consumer packaging occurs. In this instance, the galvanic packaging in bulk storage sizes can be substituted for metal containers, resulting in lower material costs, lower waste expense, and reduced concern about potential personal injury from sharp edges of discarded metal containers. Where packaging operations have sufficient capacity to go directly from harvest quantities to consumer-portioned packages, an intermediate bulk storage step can be avoided, with even further savings due to elimination of intermediate labor expense, intermediate packaging expense, and further reduced likelihood of personal injury to workers.

Not wishing to be bound by theory, it is believed that one possible mechanism for retaining fruit and/or vegetable color and flavor via inhibition of non-enzymatic browning is that the sacrificial metal of the one of the two lining metals donates an electron and the generated metal ion becomes soluble by salt formation (reactions [1] and [5]):

$$M^0 \rightarrow M^{++} + 2e^- \quad [1]$$

The low pH liquid in the package with the food product also disassociates thereby generating new ions (reaction 2):

$$2AH \rightarrow 2A^- + 2H^+(2p^+) \quad [2]$$

The electrons from reaction [1] then react with protons from reaction [2] to generate atomic hydrogen, which is a very reactive form of hydrogen, as shown in reaction [3]:

$$2p^+ + 2e^- \rightarrow 2H \quad [3]$$

The hydrogen atoms produced in reaction [3] interfere with the formation of the browning precursors formed by oxygen during the processing of the subject food in the package. This results in the formation of water by the reaction of the generated reactive hydrogen and the oxygen in the package as shown in reaction [4]:

$$2H + \tfrac{1}{2}O_2 \rightarrow H_2O \quad [4]$$

The remaining generated ions in reactions [1] and [2] will recombine to form a stable compound as shown in reaction [5]:

$$2A^- + M^{++} \rightarrow MA_2 \quad [5]$$

In the preferred embodiment, the amount of the sacrificial metal(s) to be deposited on the nomnetallic substrate is determined by the nature of the food product to be packaged (i.e., pH, weight, amount of trapped oxygen in the container, etc.). For example, the OTR of the packaging material along with the packaging surface area provides a useful working estimate of the volumetric rate at which oxygen needs to be treated over the desired shelf-life. Knowing the OTR, the package surface area, and the reaction rate between the metal ions and oxygen (determined by the sacrificial metal), the required rate of metal ion production needed may be determined. That required rate of metal ion generation is a function of the area of the sacrificial metal and the galvanic activity rate (i.e., the rate at which metal ions from the sacrificial electrode are available). The selected metals along with the pH of the solution, juice, etc., to be in the package will determine the galvanic activity rate. Accordingly the area of the sacrificial electrode can be determined.

Shelf-life of the package will then be determined by the volume of sacrificial metal provided. More metal volume gives longer shelf-life, while less metal volume give shorter shelf-life. Where a predetermined shelf life is desired, it can be obtained from the volume of the sacrificial metal and the volumetric rate at which metal ions react with oxygen. Thus, the area and volume of the sacrificial metal required can be determined and tailored to a particular food product, combination of galvanically active metals, and packaging material.

Turning now to the figures and the exemplary package embodiments depicted therein, note that the figures specifically describe are variety of likely consumer-sized packages. Bulk packages might be provided in similar shapes, but with much larger volumes, or in different large-volume shapes such as barrels, or other storage vessels.

Now then, in one preferred embodiment (see FIG. 1), the package 10 is in the form of tray-like package. Preferably, the package 10 or storage unit includes a storage volume, or compartment 12 sized and configured to contain a predetermined quantity of a food product—e.g., the fruits and/or vegetables discussed above. The container portion 11 is constructed with a substrate as described above. The container portion 11 typically includes a bottom panel 16, and a peripheral sidewall 14. In the preferred embodiment, the at least one peripheral sidewall 14 and bottom 16 are integrally formed. Extending around the upper edge of the sidewall 14 is a generally planar, outwardly extending flange 50. The flange 50 provides a mating surface to which the lid portion 52 may be attached by thermal welding, adhesive, or other suitable food-safe adhesion technique.

The container portion may be vacuum formed from a continuous sheet of substrate material, or may be hot molded, or injection molded, or formed in any other suitable process. Other suitable forming methods include, for example and without limitation, rotational molding, injection molding, blow molding, injection blow molding, extrusion blow molding, stretch blow molding, compression molding, and thermoforming. If desired, the at least one sidewall 14 and the peripheral portions or edges of the bottom 16 converge with sharp corners and/or creases 18, such that the package 10 is generally rectangular when viewed from above. Moreover, the at least one sidewall 14 can be substantially perpendicular to the bottom 16. Alternatively, the at least one sidewall 14 may form an obtuse angle relative to the bottom 16.

For purposes of illustration in FIG. 1, the lid portion 52 is transparent, while the container portion 11 is opaque.

The container portion 10 may include multiple layers 30, 31, 32. First and second metal layers 31, 32 are formed on the surface of the container portion 10 and/or the lid portion facing the storage volume 12. In one embodiment (see FIG. 2), the first metal layer 31 may be formed on an inside surface of the lid portion 52. The second metal layer 32 may be formed on the inside surface of the bottom panel 16 as well as on the inside surfaces of the sidewall 14. As discussed above, the two metal layers 31, 32 are selected of materials having different galvanic activity. Moreover, as depicted, the first and second metal layers 31, 32 may be smaller, or less coextensive that the corresponding parts of the container portion and the lid portion. Those skilled in the art, however, will also appreciate that one or more of the first and second metal layers 31, 32 may be coextensive with the corresponding part of the container portion or the lid portion.

As shown, the metal layers 31, 32 are exaggerated in thickness for purposes of illustration. In actual application, the metal layers 31, 32 are typically quite thin and represent a film on the surface of the corresponding container portions. The thickness and surface area of the two different metal layers is determined based on the expected corrosion of the sacrificial metal layer. More particularly, the sacrificial metal layer must have sufficient volume that is will continue to function throughout the planned shelf-life of the food product to be packaged therein. Accordingly, the package may be designed such that it is specifically tailored to a particular food product. Alternatively, the package may be designed such that the sacrificial metal layer will last for the planned shelf-life of the food product causing the highest rate of metal consumption during that period, with the understanding that it will be sufficient for other food products having lower rates of metal consumption. Accordingly, it will be appreciated that the two metal layers 31, 32 may be deposited or formed with different thicknesses and surface areas.

The thickness and surface are of the sacrificial metal layer, e.g., 32, may be determined as described above. The actual thickness of the sacrificial metal layer 32 may lie in the range of 1 micron ($\mu$m) to 5 centimeters (cm). As noted above, the actual thickness will determine the shelf-life for the package. The non-sacrificial metal layer 31 may have comparable or dissimilar thickness relative to the metal layer. Moreover, it should be noted that the first and second metal layers 31, 32 may be in separate pieces on different parts of the storage unit, may overlap, may be superimposed on one another, and the like. With respect to consumer-sized storage units, it is presently preferred that the two metal layers be provided on the inner surface of the lid material. There are several reasons for this preference, including ease of application of the metal to a planar sheet material, minimization of mechanical forming operations that could cause mechanical failure, cracking, delamination and the like, and placement of the galvanically active metals in the physical location where oxygen is most likely to accumulate—particularly when there is a head space in the storage unit.

When the container portion 11 has been filled, i.e., a predetermined quantity of food product has been placed in the storage volume or compartment 12, the package 10 may be sealed by placing the lid portion 52 on the container portion 11. If done in an evacuated environment, the package 10 is then complete. If not done in an evacuated environment, then it may be necessary to remove all air from the container volume before the final seal between the lid portion 52 and the container portion 11 is completed.

The lid portion 52 may be friction fitted with the sidewalls 14 of the container portion, if desired. That arrangement may be adequate for products where an internal vacuum is not required. In the preferred embodiment, the substrate for the lid portion 52 can be formed of that same plastic material that forms the substrate of the container portion 11. Alternatively, the lid portion 52 can be formed of a different plastic substrate material than that which forms the substrate of the container portion 11.

Figure 2:
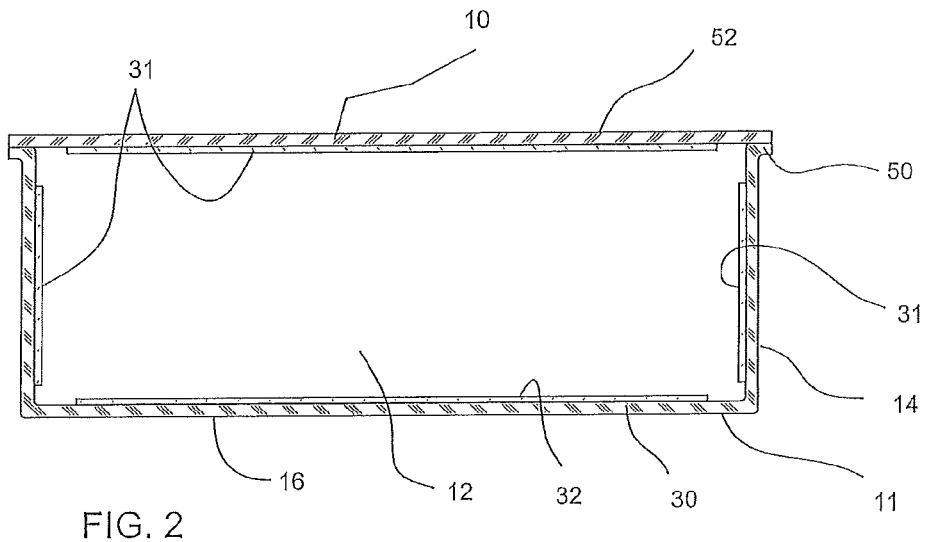
FIG. 2 is an enlarged cross-sectional view of the package of FIG. 1 with a first galvanic panel configuration.

Various configurations for the two metal layers 31, 32 are contemplated in addition to the arrangement of FIGS. 1 and 2. With respect to that embodiment, even though multiple metal panels 32 are illustrated, it should specifically be noted that it may be sufficient to use a single film of the first metal material 31 and a single film of the second metal material 32.

Figure 3:
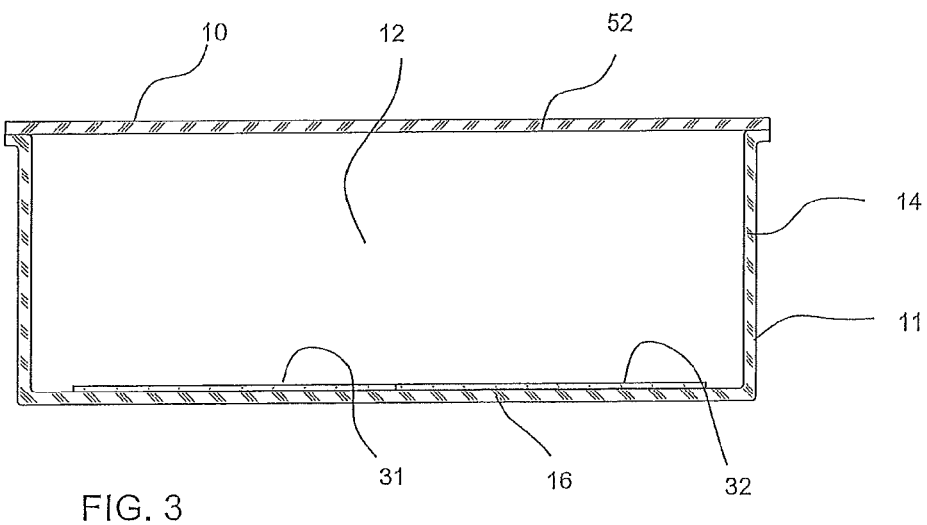
FIG. 3 is an enlarged cross-sectional view of the package of FIG. 1 with a second galvanic panel configuration.
Figure 4:
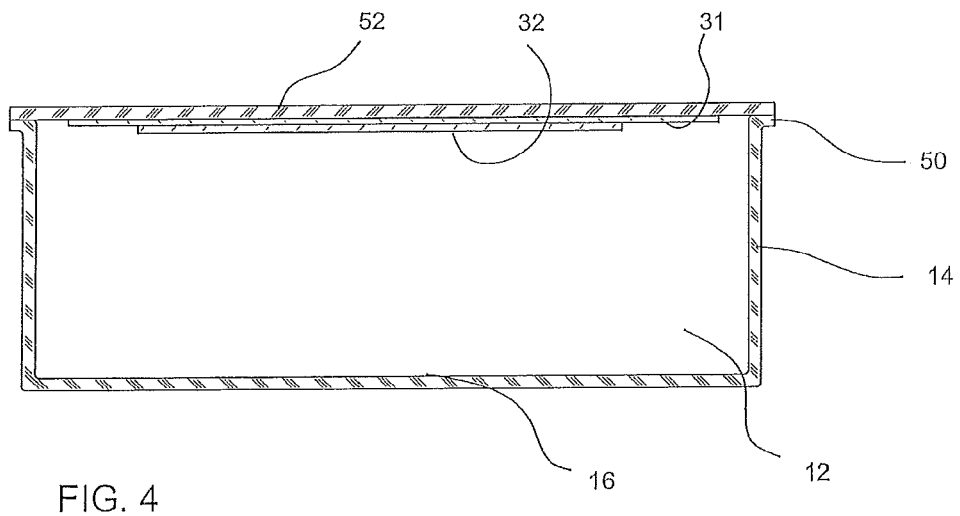
FIG. 4 is an enlarged cross-sectional view of the package of FIG. 1 with a third galvanic panel configuration
Figure 5:
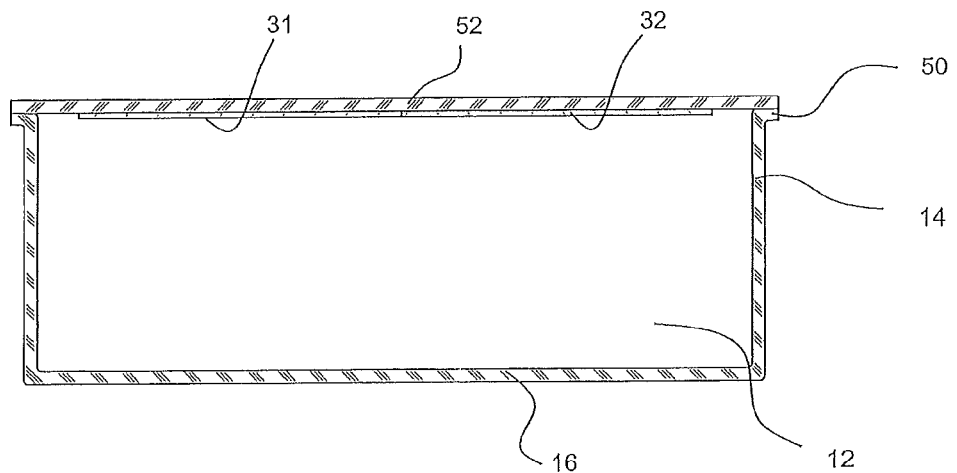
FIG. 5 is an enlarged cross-sectional view of the package of FIG. 1 with a fourth galvanic panel configuration.

Turning now to FIG. 3, the first metal layer 31 is positioned adjacent to the second metal layer 32 on the bottom panel 16 of the container portion 11. If needed, the first and second metal layers 31, 32 may also extend to adjacent sidewalls or sidewall portions 14 of the container portion 11. If desired, the two metal layers 31, 32 may also be provided on the interior surface of the lid portion 52 (see FIG. 5) in a side-by-side arrangement. Furthermore, the second metal layer 32 may be applied over a portion of the surface of the first metal layer 31 in a stacked arrangement (see FIG. 4). That stacked arrangement may also be provided on the bottom panel 16, or for that matter on one or more of the sidewalls 14. In any event, it is preferred that the metal layer which is sacrificial contacts the packaged food product.

As shown in FIG. 6, the package 20 can be in the form of a pouch having an internal compartment 36 (shown in FIG. 7) for containing a predetermined quantity of a food product as described above. The pouch 20 may be formed as a tubular member from a flexible substrate such that at least one longitudinal seal 62 extends along the tube. To seal the ends, a pair of spaced-apart transverse seals 60 may be provided, one at each end of the storage unit 20. In other embodiments (not shown), the pouch 20 can be formed using other sealing arrangements including, for example, multiple longitudinal seals. The seals 60, 62 can be formed by heat sealing, thermal welding, adhesive, or any other suitable sealing technique.

Typically, the pouch 20 may be formed of a material 64 including a substrate or first layer 24 and a second layer 26 deposited on at least a portion of the first layer 24. The second layer 24 preferably includes two different metal layers that may be disposed adjacent to one another, or on opposite sides of the pouch 20 facing the container storage volume 36. Ordinarily, the first layer 24 includes a plastic substrate as discussed herein. The two metals, or metal films deposited on the plastic substrate have different galvanic activity, as discussed above. If desired, the second layer 26 may cover the entire interior surface of the first layer 24. Alternatively, the second layer 26 may cover only a portion of a surface of the first layer 24 (not shown). The material 64 used to form the pouch 20 may itself be a thin film suitable for forming into a tube with a longitudinal seal 62 and sealed at each end to form the pouch 20.

Preferably, as shown in FIG. 6, the pouch 20 includes at least one sidewall 28 and a bottom 34, which define the compartment 36. The compartment 36 is sized and configured to contain a predetermined quantity of food product. For example, the compartment 36 may have a volume ranging from about 1.8 in.$^3$ to about 36 in.$^3$ The size of the compartment 36 can be selected, as desired, to hold a single serving of fruits and/or vegetables or multiple servings of fruits and/or vegetables.

In another optional configuration (see FIG. 8), the package 50 includes a generally cylindrical container portion 53 having a bottom 54 and a sidewall 52 extending upwardly from the bottom 54, the sidewall 53 and the bottom 54 cooperate to define an inner compartment or storage volume 56, sized and configured to contain a predetermined quantity of a food product.

In the preferred embodiment, the container portion 53 includes a first layer 58 including a plastic substrate. A first metal film 60 is deposited on at least a portion of the first layer 58. A second metal film 61 is also deposited on a corresponding portion of the first layer, and may be spaced from, adjacent to, or overlapping with the first metal film 60. The two metal films have different galvanic activity as discussed above. This configuration is also suitable for use with a metal substrate having an inert plastic coating thereon (not shown).

Figure 8:
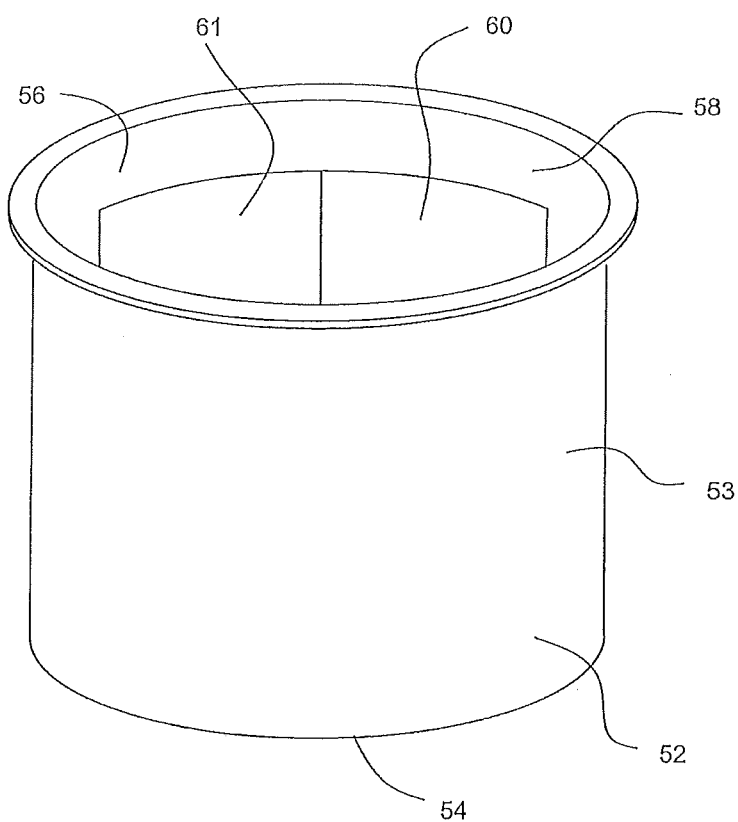
FIG. 8 is a schematic perspective view of a cylindrical package embodiment having a transparent lid.
Figure 9:
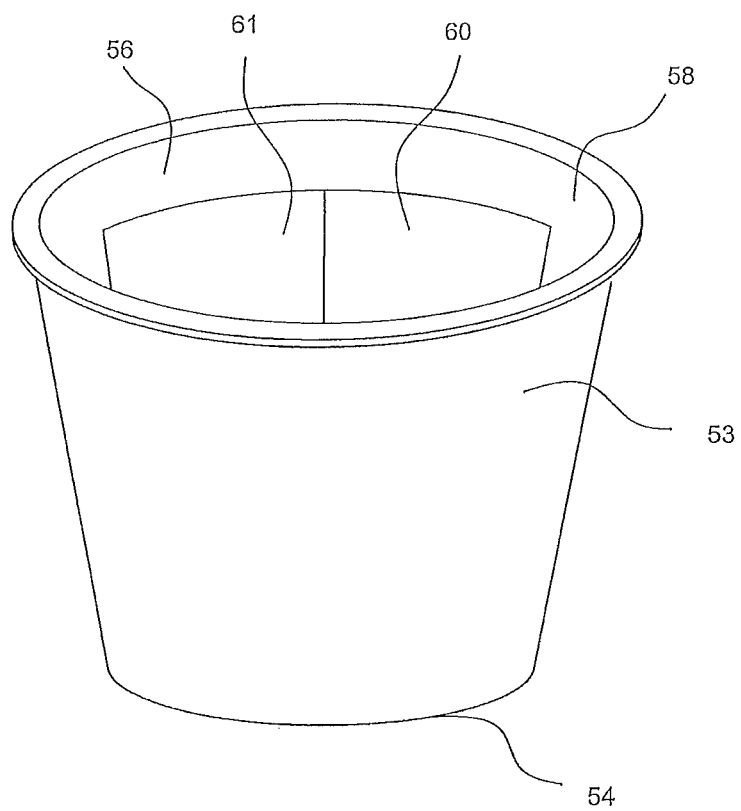
FIG. 9 is a schematic perspective view of a frustoconical package embodiment having a transparent lid.

In a variation of the embodiment of FIG. 8, the container portion 53 may be provided with a frustoconical sidewall (see FIG. 9) extending upwardly from the base 54.

It is contemplated that the package, and its components, may be formed by injection molding a plastic to form a plastic substrate for the container portion, then depositing two or more metals with different conductivity properties as films on the surface of the plastic substrate. Alternatively, the metal films may be applied to the substrate while in sheet form. Then, the sheet and associated metal films may be formed into the container portion, such as by thermal forming, vacuum forming, or the like. If glass is used for the container, then the glass would preferably be formed to the desired shape using conventional processes and techniques.

Where the metal films are applied to the substrate, other techniques may also be used including, for example and without limitation, plasma enhanced chemical vapor deposition, electron-beam deposition, plasma spray coating, and chemical vapor or atomic layer deposition.

As described above, the galvanic packaging concept has included the use of two or more metal layers or films attached to the package and in contact with the fruit or vegetable in the package. It has, however, been found that the benefits of this galvanic packaging arrangement can also be attained where the sacrificial metal is simply included in the package along with the package contents. The sacrificial metal is the one which will be consumed over time in the galvanic process. Magnesium is particularly suitable for use as the sacrificial metal. Thus, by depositing a predetermined quantity of the sacrificial metal in the package, where the quantity is determined according to its time rate of consumption and a predetermined package storage life, when the package is opened after storage the sacrificial metal has been essentially completely consumed and the packaged contents can be used without the need to remove the sacrificial metal. Generally speaking, for a consumer product, the storage life corresponds to the time typically encompassed from packaging through distribution of the packaged product. For a bulk storage package, the storage life corresponds to the time typically encompassed from packaging, through distribution, and storage. Packaged products incorporating a predetermined quantity of sacrificial metal may include a specified release date or a notice that the package should not be used before a date certain, where the release date or date certain is selected to exceed the predetermined package storage life.

To package fruits and/or vegetables in the package disclosed herein, the package is first formed as described above. The package is then filled with a predetermined quantity of a food product. Finally, the package is sealed to maintain freshness of the food pro duct.

In this specification, the word "about" is often used in connection with a numerical value to indicate that mathematical precision of such value is not intended. Accordingly, it is intended that where "about" is used with a numerical value, a tolerance of ±10% is contemplated for that numerical value.

Moreover, when the words "generally" and "substantially" are used in connection with geometric shapes, it is intended that precision of the geometric shape is not required but that latitude for the shape is within the scope of the disclosure. When used with geometric terms, the words "generally" and "substantially" are intended to encompass not only features which meet the strict definitions but also features which fairly approximate the strict definitions. In this connection, the term "rounded" is intended to also include configurations comprising two or more substantially straight line segments describing the "rounded" feature.

While the foregoing describes in detail a package for fruits and vegetables having galvanic functionality, methods of making the package, and methods of use, it will be apparent to one skilled in the art that various changes and modifications may be made to the disclosed package and methods and further that equivalents may be employed, which do not materially depart from the spirit and scope of the invention. Accordingly, all such changes, modifications, and equivalents that fall within the spirit and scope of the invention as defined by the appended claims are intended to be encompassed thereby.

We claim:

1. A package for fruits and vegetables having galvanic functionality, said package comprising:
   a storage unit formed of a nonmetallic substrate and having at least one internal surface; and
   a first metal deposited on the at least one internal surface of the storage unit,
   a second metal in the storage unit,
   wherein the first metal and the second metal have different galvanic properties, one of the first metal and the second metal being sacrificial.

2. The package of claim 1, wherein the second metal comprises the sacrificial metal.

3. The package of claim 1, wherein the second metal comprises magnesium.

4. The package of claim 1, wherein the second metal is deposited on the at least one internal surface of the storage unit.

5. The package of claim 1, wherein the nonmetallic substrate comprises a polymeric material.

6. The package of claim 5, wherein the nonmetallic substrate comprises a glass.

7. The package of claim 5, wherein the nonmetallic substrate comprises a plastics material.

8. The package of claim 5, wherein the plastics material includes at least one plastic selected from the group consisting of ethylene polymers, propylene polymers, styrene polymers, vinyl chloride polymers, halogenated olefin polymers, vinyl polymers, acrylic polymers, polyamides, silicone polymers, polyacetals, poly ethers polycarbonates, polyesters, polyurethanes, polysulfides, polysulphones, petroleum resins, coumaroneidene resins, silicon rubbers, amino-resins, epoxide resins, alkyd resins, polyallyl esters, and combinations thereof.

9. The package of claim 8, wherein the plastics material includes at least one plastic selected from the group consisting of polyethylene, polypropylene, polyethylene terephthalate, polycarbonate, polyvinyl chloride, and combinations thereof.

10. The package of claim 1, wherein the first metal and the second metal are selected from the group consisting of aluminum, tin, copper, magnesium, chromium, iron, zinc, nickel, cobalt, and combinations thereof.

11. The package of claim 1, wherein the storage unit is in the form of a pouch, can, or tray.

12. The package of claim 1, wherein the storage unit is defined by at least one sidewall and a bottom.

13. The package of claim 1, wherein the package contains a food product having a pH less than about 8.

14. The package of claim 1, wherein the package is rigid.

15. The package of claim 1, wherein the package is flexible.

16. A method of making a package for food products having galvanic functionality comprising:
   forming a nonmetallic storage unit having at least one internal surface;
   applying a first metal to the at least one internal surface; and depositing a second metal in the storage unit, wherein the first metal and the second metal have different galvanic properties, one of the first metal and the second metal being sacrificial.

17. The method of claim 16, wherein the applying step includes electrolytic deposition.

18. The method of claim 16, wherein the applying step includes vacuum deposition.

19. The method of claim 16, wherein the applying step includes autocatalytic deposition.

20. The method of claim 16, wherein the applying step includes plasma enhanced chemical vapor deposition.

21. The method of claim 16, wherein the applying step includes electron-beam deposition.

22. The method of claim 16, wherein the applying step includes plasma spray coating.

23. The method of claim 16, wherein the applying step includes chemical vapor deposition.

24. The method of claim 16, wherein the applying step includes atomic layer deposition.

25. The method of claim 16, wherein the depositing step includes applying the second metal to the at least one internal surface.

26. The method of claim 16, wherein the forming step includes attaching a lid, the lid includes a second internal surface, and the at least one internal surface includes the second internal surface.

27. A method of packaging a food product comprising:
forming a nonmetallic storage unit having a lining including a first metal and a second metal;
placing a predetermined quantity of food product in the plastic storage unit, where the food product has a pH less than about 8; and
sealing the nonmetallic storage unit,
wherein the first metal and the second metal have different galvanic properties, one of the first metal and the second metal being sacrificial.

28. The method of claim 27, wherein the food product has a pH ranging less than about 6.

29. The method of claim 27, wherein the first metal and the second metal are selected from the group consisting of aluminum, tin, copper, magnesium, chromium, iron, zinc, nickel, cobalt, and combinations thereof.

30. The method of claim 27 further including contacting the food product with one of the first and second metals.

* * * * *